United States Patent [19]
Dentini et al.

[11] Patent Number: 4,960,612
[45] Date of Patent: Oct. 2, 1990

[54] THERMAL CONDUCTOR ASSEMBLY METHOD

[75] Inventors: Mark S. Dentini, Holland, Pa.; Joe A. Fulton, Ewing, N.J.; Sungho Jin, Millington, N.J.; John J. Mottine, Jr., West Keansburg, N.J.; Lloyd Shepherd, Madison, N.J.; Richard C. Sherwood, New Providence, N.J.

[73] Assignee: AT&T Bell Laboratories, Murray Hill, N.J.

[21] Appl. No.: 290,550

[22] Filed: Dec. 27, 1988

Related U.S. Application Data

[62] Division of Ser. No. 69,792, Jul. 2, 1987, Pat. No. 4,838,347.

[51] Int. Cl.⁵ .............................................. B05D 3/14
[52] U.S. Cl. ...................................... 427/47; 427/127; 427/129; 427/130; 427/380; 427/385.5
[58] Field of Search ................. 427/47, 127, 129, 130, 427/380, 385.5

[56] References Cited

U.S. PATENT DOCUMENTS

| | | | |
|---|---|---|---|
| 3,128,544 | 4/1964 | Allingham | 427/47 X |
| 4,336,278 | 6/1982 | Pertzsch | 427/47 |
| 4,448,837 | 5/1984 | Ikeda et al. | 428/215 |
| 4,546,037 | 10/1985 | King | 427/47 X |
| 4,548,862 | 10/1985 | Hartman | 427/47 X |

Primary Examiner—Bernard Pianalto
Attorney, Agent, or Firm—Roderick B. Anderson

[57] ABSTRACT

A compressible thermally conductive member comprises a polymer field with thermally conducting-magnetically aligned particles comprising a base portion and a multiplicity of protrusions extending from at least one surface of the base portion.

9 Claims, 3 Drawing Sheets

THERMAL CONDUCTOR ASSEMBLY METHOD

This is a division of application Ser. No. 069,792 filed Jul. 2, 1987 now U.S. Pat. No. 4,838,347.

BACKGROUND OF THE INVENTION

1. Field of the Invention

This invention relates to an assembly having means for conducting heat away from a heat producing member.

2. Related Art

In the electronics industry, especially where high power and/or a high density of devices are employed there is often a need to provide means for dissipating the heat generated by or at such devices. Without such heat dissipation the life of such devices may be adversely and catastrophically affected. In the past, heat dissipation was accomplished by means of blowing air over the device to be cooled and/or contacting the device with a heat sink which may be provided with cooling fins for increasing the surface area and hence the efficiency of heat dissipation. Generally, such heat sinks have been rigid metallic bodies or rigid heat conductive ceramics. In addition, elastomers filled with heat conductive particles have been employed to conduct heat away from certain devices. However, where the device to be cooled is mounted in an enclosure or housing or where there is a variation in spacing between such device and the enclosure or heat sink, it is often difficult to provide good thermal conduction of heat from the device to the heat sink or the housing to dissipate the heat from the device and prevent excessive heat buildup within the housing. One problem has been the difficulty in making good contact between the device and the means employed for dissipating the heat without undue pressure on the device.

SUMMARY OF THE INVENTION

We have now developed a highly compressible, thermally conductive member which, when positioned under compression adjacent a heat source can efficiently transfer heat through the member away from the heat source.

The compressible thermally conductive member comprises a polymer filled with thermally conducting, magnetically aligned particles such that, at least when under compression, a thermal path exists across the thickness of the member.

The magnetic alignment of the particles form a multiplicity of columns extending across the thickness of the member and wherein, on at least one surface, the columns extend from the surface outwardly to form a multiplicity of finger-like protrusions.

We have surprisingly discovered that such magnetically aligned thermally conductive particles in a polymer matrix result in significantly greater thermal conductivity across the thickness of the polymer (typically, at least twice the conductivity for the volume loading generally employed) or compared with structures of the same particles and particle loading, but not magnetically aligned.

DETAILED DESCRIPTION

Figure 1:
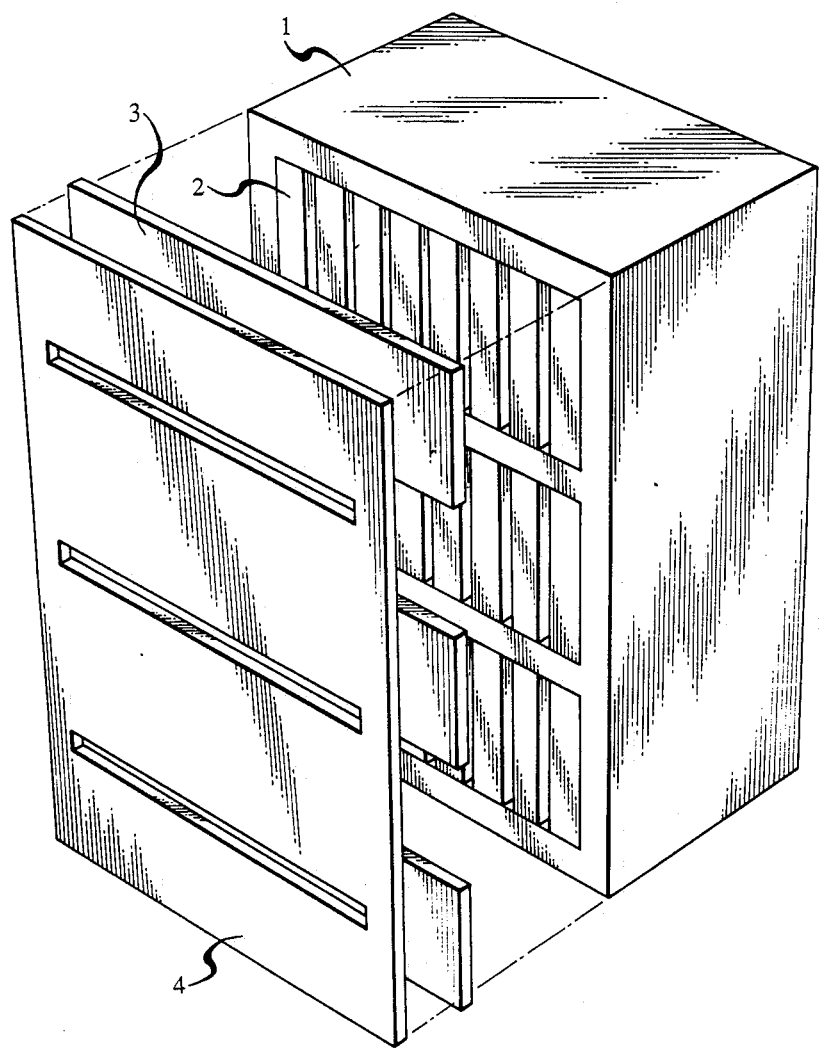
FIG. 1 is a representation of an electronic assembly which includes novel means for dissipating heat from the assembly.

In accordance with FIG. 1, there is shown an electronic assembly 1 which comprises a plurality of heat-producing electronic devices 2 stacked adjacent and spaced from one another, a compressible resilient thermally conductive sheet 3 abutting portions of the electronic devices 2 and a metal enclosure 4 surrounding the device and abutting the thermally conductive sheet 3. At least a part of the enclosure 4 presses against and compresses a major surface of the sheet 3 to allow the heat conducted from the device 2 to pass through the sheet 3 to the enclosure 4 thence and be dissipated into the atmosphere. The assembly may further include a fan (not shown) to aid in cooling. In place of the enclosure, it is understood that any type of heat sink or heat dissipating means can be employed. Generally, in an assembly as shown in FIG. 1 there is a large variation in spacing between the enclosure surface and the various devices therein. This gives rise to the need for a highly compressible yet thermally conductive member, such as the thermally conductive sheet described herein, to effectively cool all of the devices.

Figure 2:
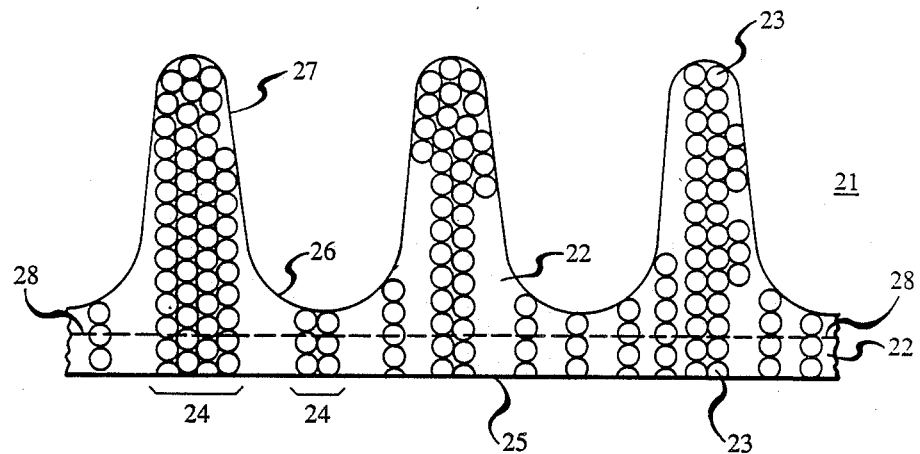
FIG. 2 is a schematic cross-sectional representation of a compressible thermal conductor useful in the present invention.

Referring to FIG. 2 there is shown a thermally conductive sheet 21 comprising a compressible resilient compliant polymer matrix 22 having imbedded therein an array of thermally conducting magnetic particles 23. The particles 23, as shown, are aligned in spaced columns 24. The particles 23 within a column 24 abut one another or are otherwise sufficiently close, that at least under compression, will conduct heat along the column length from one major surface of the sheet to the other. One major surface 25 of the sheet 21 is essentially flat. The other major surface 26 of the sheet 21 is provided with a multiplicity of finger-like protrusions 27 comprising columns 24 of thermally conductive particles 23 embedded in the polymer matrix 22. These protrusions may extend to such a length that at least upon being deformed under an applied pressure, adjacent protrusions overlap one another or alternatively may be of shorter lengths. The overlapping of the protrusions allows for heat dissipation laterally across the sheet, as well as through the sheet thickness while still affording high compressibility of the sheet with minimal applied pressure. Generally, the greater the height of the protrusion (prior to sagging of the protrusion) the more compressible the member with a given applied force. Optionally, the base of the sheet 21 may have embedded therein or on the flat surface 25 a thermally conducting screen 28. The screen is preferably made of a magnetic metal and acts not only to enhance lateral thermal conductivity, but aids in the formation of a uniform array of columns of magnetic particles in the sheet 21.

The polymer may be any polymer which preferably is compliant and resilient when loaded with the thermally conductive particles. Examples of suitable polymers are silicone elastomers, and flexible epoxies and polyurethanes. A heat curable silicone elastomer is generally the preferred polymeric material. Further, the particle loaded polymer may be formed by any of the commonly known techniques including casting, drawing and extrusion and may be in the form of a foam or solid.

Particles which are suitable for use, while preferably being spherical, are not limited by their shape and may even be in the form of flakes. Suitable particulate materials which are thermally conducting and magnetic are metals such as nickel, cobalt, and iron and their magnetic alloys. Other suitable magnetic, thermally conducting particles include magnetic thermally conducting ceramics, oxides and intermetallic compounds as are known in the art. Preferred particles are often composite materials, for example, as nickel having a coating of copper thereover to increase its thermal conductivity and a second coating of a relatively inert metal such as silver to protect the copper from oxidation. Alternatively, the composite particle may have a non-magnetic core with a magnetic coating. Also, in addition to the magnetic particles, the thermally conductive member may incorporate non-magnetic thermally conductive particles such as non-magnetic metals, e.g. copper or ceramics, e.g. alumina and beryllia.

In order to achieve the preferred columnar structure, the particles are aligned by applying a magnetic field to the particles in the polymer during curing of the polymer.

The thickness of the sheet is not critical and is dependent upon the particular use to which it is to be put and the maximum and/or minimum pressure to be applied in use. Typical thicknesses for the main body of the sheet are from 1 to 100 mils with protrusions extending therefrom, an additional 5 to 500 mils. The length of the protrusions are at least equal to a multiple of the particle diameter so that at least several particles are incorporated in the protrusion.

For certain applications, where the total area of the sheet within an enclosure is large, for example several square meters, and/or where there is a significant variation in surface uniformity of the device or devices to be cooled and/or the dissipating medium or enclosure, it is extremely important that the sheet be able to be highly compressible with small applied pressures to insure sufficient contact area of the sheet and the device dissipating medium between which the sheet is interposed. Generally, deformations in the order of from 10% to 50% of the original overall thickness of the sheet under applied pressures of typically about 10 psi are attained. Such a sheet can be achieved, for example, by employing a silicone elastomer as the polymeric matrix loaded to about 50 volume percent with essentially spherical nickel based particles having a particle size of from 1 to 10 mils which are aligned to form the desired columnar structure.

Figure 3:
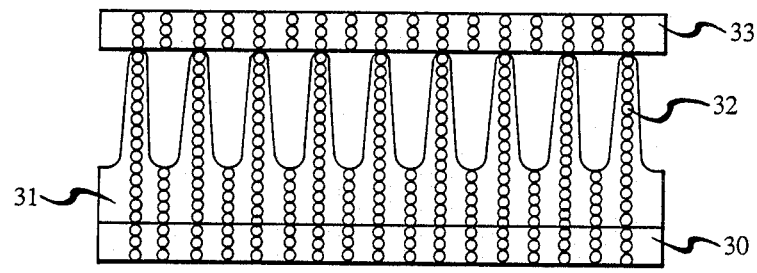
FIGS. 3 and 4 are schematic cross-sectional representations of other embodiments of a compressible thermally conductive member.
Figure 4:
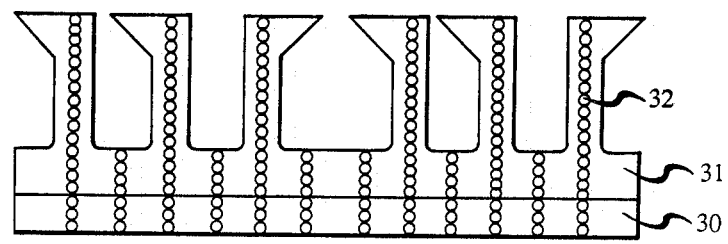

FIGS. 3 and 4 show alternative structures of the novel thermally conductive sheet material. It should be noted that the sheet material may have other uses in addition to heat transfer, e.g. as a gasket material and as an electrical conductor, such as to provide a ground plane when the thermally conductive particles also provide an electrically conducting path. Further, one may interpose another thermal conductor, e.g. a metal foil or sheet between the magnetically aligned thermally conductive polymer sheet and/or the device to be cooled and the heat dissipator. This could enhance thermal conduction. Also, the polymer sheet can be employed between heat producing devices when there is also lateral thermal conduction toward the edges of the sheet so as to aid in heat dissipation.

The following table provides a comparison of characteristics as between a 175 mil thermally conductive silicone elastomeric sheet filled to 30% by volume with 3 mil mean diameter gold coated nickel spheres which are aligned to provide the structure having protrusions as described with reference to FIG. 2, without the optional screen and a similar material which does not have the protrusions but is essentially flat on both major surfaces.

TABLE I

Comparison between novel Thermally Conductive Sheet and a similar sheet without protrusions

| | Novel Sheet | Flat Sheet |
|---|---|---|
| Displacement (at 5 psi) (Reduction in Thickness) | 85 mil | 5 mil |
| % Deformation (at 5 psi) | 48.6% | 2.9% |
| R(Z-Direction Contact Resistance, 25 × 50 mil Pad Area) | 25-75 mΩ | 2800-4700 mΩ |
| Thermal Conductivity | 0.745 watt/m. °C. (at 12 psi) | 1.74 watt/m. °C. (at 20 psi) |

As can be seen from the Table, the structure having the protrusions is significantly more deformable than its flat counterpart and surprisingly exhibits a comparable thermal conductivity to its flat counterpart.

In manufacture, the height, density and shape of the thermally conductive protrusions can be controlled by adjusting one or more of the process or materials parameters, e.g. the magnetic field direction and/or strength, the elastomer viscosity and the particle loading.

One method of making a highly durable, compressible, thermally conductive sheet is to form a composite from two or three discrete layers. Such a sheet is shown in FIG. 3. The first layer 30 provides a base to support the second layer 31. The second layer 31 forms the finger-like protrusions 32 and the optional third layer 33 covers the protrusions 32 so as to increase durability as well as lateral heat conductivity. Layers 31 and 32 are monolithic in the final assembly with layer 33 being on top of the protrusions. This sandwich structure may be held in a frame running along the periphery of the composite. It should be noted that the protrusions may be formed at an angle other than normal to the base material. This would enhance ease an uniformity in the compression of the sheet.

By was of example, all three layers are preferably made of the same precursor materials, e.g. nickel particles coated with about 25 microns of copper to enhance thermal conduction and about 0.6 microns of a relatively inert metal such as silver or gold to prevent oxidation of the copper. Particles with a mean particle size range of about 7 to 10 mils are employed. Heat curable silicone elastomers which have an elongation factor before rupture of at least 350%, a Shore A durometer of less than 50 and a tear strength of at least 85 lbs. per inch are preferred. An example of such an elastomer is Dow Corning Silastic E.

The first and third layers are made with a high particle loading, e.g. about 50 volume percent. The first layer is drawn to a thickness of typically 15 to 25 mils and the particles are aligned to form a columnar pattern by means of a magnetic field of about 300 oersteds for two minutes with partial heat curing at 110 degrees C. The second layer is drawn over the partially cured first layer to a thickness of 20 mils. The second layer generally has a particle loading of between 30 to 50 volume percent. This layer is drawn to form the protrusions using a magnetic field of about 1100 oersteds with the protrusion height being controlled by the size of the magnetic gap. This composite is cured in a magnetic field at about 110 degrees C. for about 15 minutes. The third layer is made in the same manner as the first layer and applied over the composite of the first two layers. All sections of the composite are then additionally cured for about ten hours, preferably in an inert atmosphere, e.g. nitrogen or argon, at about 140 degrees C. It should be noted that, in use, two or more sheets with protrusions on one surface can be coupled, or a sheet can be folded over itself, such that the outer surfaces are both flat, both have the protrusions or one is flat and one has the protrusions.

What is claimed is:

1. A process for making a thermally conductive compressible sheet comprising the steps of: forming a first layer of uncured elastomer, having first magnetic particles dispersed therein; subjecting the first layer to a first magnetic field for aligning the first magnetic particles so as to form spaced to columns of such first magnetic particles; partially curing the first layer; forming over the partially cured first layer a second layer of uncured elastomer containing second magnetic particles dispersed therein; applying a second magnetic field across the first and second layers of such magnitude as to cause finger-like protrusions, each having a length which is greater than its width or its thickness, to form extending from the second layer; and curing the first and second layers so as to stabilize permanently said finger-like protrusions.

2. The process of claim 1 wherein:
the first magnetic field is significantly smaller than the second magnetic field.

3. The process of claim 2 wherein:
the first magnetic field is of insufficient magnitude to cause any finger-like protrusions to extend from the first layer.

4. The process of claim 3 wherein:
the first magnetic field has a magnitude of about 300 oersteds and the second magnetic field has a magnitude of about 1100 oersteds.

5. The process of claim 4 wherein:
the first layer has a thickness of about 15-25 mils and is partially cured by heating at about 110 degrees C. for approximately two minutes.

6. The process of claim 5 wherein:
the second layer has a thickness of about 20 mils and the first and second layer are cured by heating them in the presence of the second magnetic field at about 110 degrees C. for about 15 minutes.

7. The process of claim 1 furthering including the step of:
providing a third layer over said protrusions, said third layer being similar to said first layer.

8. The process of claim 1 wherein:
the second magnetic particles are spherical and each have a predetermined diameter;
and each of the finger-like protrusions has a length at least equal to a multiple of said predetermined diameter.

9. The process of claim 8 wherein:
each of the finger-like protrusions extends to such a length that at least upon being deformed under an applied pressure, adjacent protrusions overlap one another.

* * * * *